(12) United States Patent
Schubert et al.

(10) Patent No.: US 6,294,475 B1
(45) Date of Patent: Sep. 25, 2001

(54) CRYSTALLOGRAPHIC WET CHEMICAL ETCHING OF III-NITRIDE MATERIAL

(75) Inventors: E. Fred Schubert, Canton; Dean A. Stocker, Jamaica Plain, both of MA (US)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 09/338,709

(22) Filed: Jun. 23, 1999

Related U.S. Application Data

(60) Provisional application No. 60/090,409, filed on Jun. 23, 1998.

(51) Int. Cl.[7] .................................................. H01L 21/20
(52) U.S. Cl. ......................... 438/712; 438/718; 438/749
(58) Field of Search .................................. 438/712, 718, 438/749

(56) References Cited

U.S. PATENT DOCUMENTS

| | | | | |
|---|---|---|---|---|
| 4,397,711 | * | 8/1983 | Donnelly et al. | 156/643 |
| 5,059,552 | * | 10/1991 | Harder et al. | 437/129 |
| 5,880,485 | * | 3/1999 | Marx et al. | 257/94 |

FOREIGN PATENT DOCUMENTS 0383215    8/1990   (EP) .

OTHER PUBLICATIONS

Kim, B.J., J.W. Lee, H.S. Park, Y. Park and T.I. Kim, "Wet Etching of (0001) GaN/Al$_2$O$_3$ Grown by MOVPE", *Journal of Electronic Materials*, vol. 27, No. 5, 1998, pp. L32–L34.

Rotter, T., D. Uffmann, J. Ackermann, J. Aderhold, J. Stemmer and J. Graul, "Current Controlled Photoelectrochemical Etching of GaN Leaving Smooth Surfaces", *Nitride Semiconductors Symposium*, Dec. 1–5, 1997, pp. 1003–1008.

Weyher, J.L., S. Müller, I. Grzegory and S. Porowski, "Chemical Polishing of Bulk and Epitaxial GaN", *Journal of Crystal Growth*, vol. 182, 1997, pp. 17–22.

* cited by examiner

*Primary Examiner*—Robert Kunemund
(74) *Attorney, Agent, or Firm*—Samuels, Gauthier & Stevens, LLP

(57) ABSTRACT

A method of processing III-Nitride epitaxial layer system on a substrate. The process includes exposing non-c-plane surfaces of the III-nitride epitaxial layer system, for example by etching to a selected depth or cleaving, and crystallographical etching the epitaxial layer system in order to obtain crystallographic plane surfaces. In an exemplary embodiment, the III-Nitride epitaxial layer system includes GaN. In accordance with one aspect of the exemplary embodiment, the etching step includes reactive ion etching in a chlorine-based plasma, PEC etching in a KOH solution or cleaving, and the crystallographical etching step includes immersing the epitaxial layer system in a crystallographic etching chemical, such as phosphoric acid, molten KOH, KOH dissolved in ethylene glycol, sodium hydroxide dissolved in ethylene glycol, tetraethyl ammonium hydroxide, or tetramethyl ammonium hydroxide. Speaific etching planes are chosen in accordance with varying the orientation of the exposing step, the etching chemical, and the temperature at which the epitaxial layer system is etched.

20 Claims, 8 Drawing Sheets

| CHEMICAL | TEMPERATURE (°C) | ETCH RATE (µm/min) | ETCHING PLANES OBSERVED |
|---|---|---|---|
| PHOSPHORIC ACID ($H_3PO_4$) | 108 – 195 | 0.013 – 3.2 | $\{10\bar{1}2\}, \{10\bar{1}3\}$ |
| POTASSIUM HYDROXIDE (KOH), MOLTEN | 150 – 247 | 0.003 – 2.3 | $\{10\bar{1}0\}, \{10\bar{1}1\}$ |
| 10-50% KOH IN ETHYLENE GLYCOL ($CH_2OHCH_2OH$) | 90 –182 | 0.0015 – 1.3 | $\{10\bar{1}0\}$ |
| 20% NaOH IN ETHYLENE GLYCOL | 178 | 0.67 – 1.0 | NONE |
| TETRAETHYL AMMONIUM HYDROXIDE (TEAH) | 91 | 0.007 | $\{10\bar{1}1\}$ |
| TETRAMETHYL AMMONIUM HYDROXIDE (TMAH) | 76 | 0.013 | $\{10\bar{1}1\}$ |

*FIG. 4*

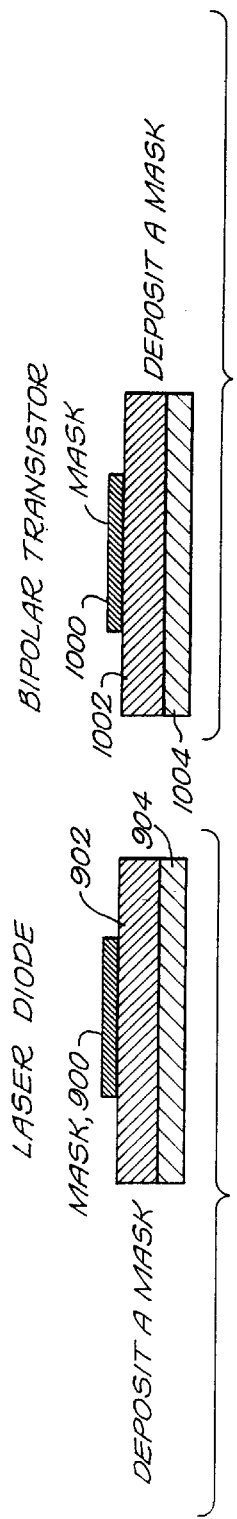
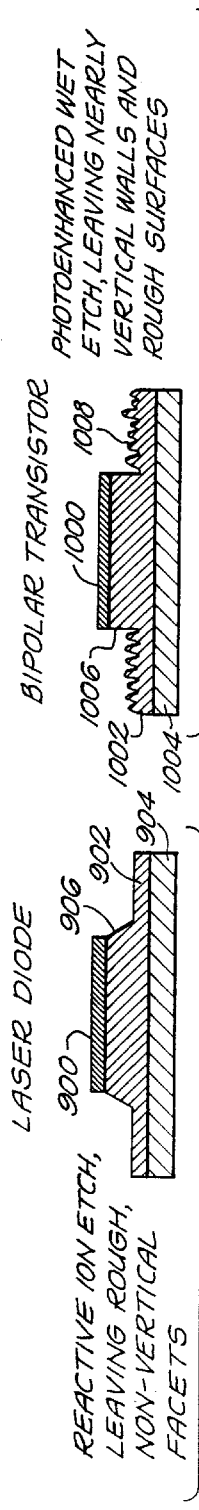
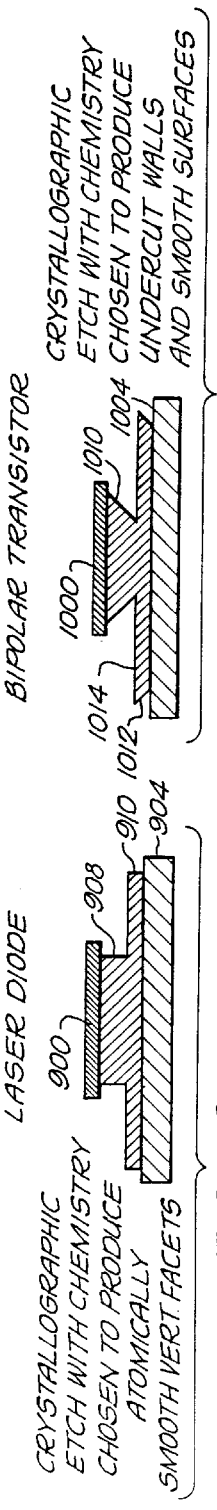
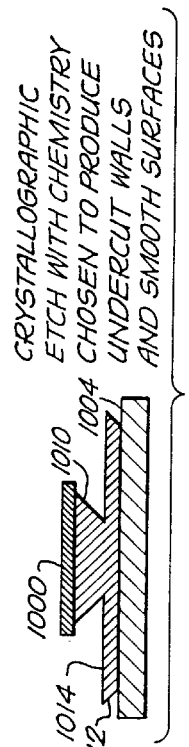
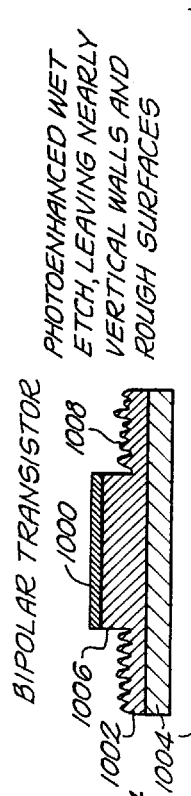
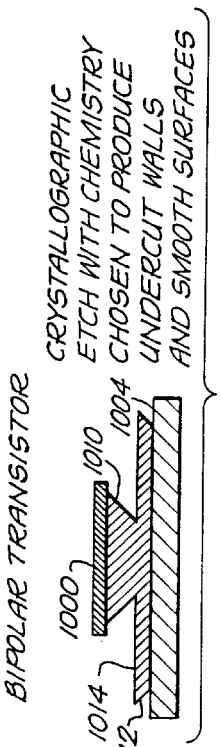

CRYSTALLOGRAPHIC WET CHEMICAL ETCHING OF III-NITRIDE MATERIAL

PRIORITY INFORMATION

This application claims priority from provisional application Ser. No. 60/090,409 filed Jun. 23, 1998.

SPONSORSHIP INFORMATION

This invention was developed with funding from the Office of Naval Research under grant no. N00014-98-1-0194 and from the National Science Foundation under grant no. ECS-9714047. The government has certain rights to the invention.

BACKGROUND OF THE INVENTION

The invention relates to the field of semiconductor etching, and in particular to a process of crystallographic wet chemical etching of III-Nitride material, and in particular gallium nitride.

The III-Nitride materials system, gallium nitride (GaN) and its indium- and aluminum-containing alloys, shows great promise for producing high-speed electronic devices that operate efficiently at high temperatures. III-Nitrides are the material of choice for producing light-emitting devices including LEDs and lasers that operate at wavelengths throughout the visible and UV parts of the electromagnetic spectrum. These materials are extremely stable, allowing them to be used in high temperature and corrosive environments. Because of this stability, it is difficult to find methods for etching of III-Nitrides.

Most processing of the III-Nitrides is currently done by dry plasma etching. There are several disadvantages to dry etching, including rough surface profiles, ion-induced damage in the exposed surface areas and difficulty in obtaining smooth etched sidewalls, which are required for lasers, the expense of the equipment required.

Photoenhanced electro-chemical (PEC) wet etching has also been used for etching of GaN. PEC etching has the advantage of low surface damage and relatively low equipment cost, but there has not yet been found a method for producing smooth etched vertical sidewalls, which are required for lasers.

Even what seems to be a very small roughness can have a large effect on the reflectivity of a laser facet. FIG. 1 illustrates this point, showing a graph of the maximum reflectivity of a laser facet as a function of surface roughness in a typical InGaN/GaN laser structure. The best published roughness results from several different experimental groups are indicated by arrows in the figure. Note that most etching techniques produce a roughness of approximately 50 nm, allowing a maximum specular reflectivity of less than 1%. Production of laser facets using an etching technique is preferable to using cleaving or polishing because an entire wafer of several thousand lasers can be produced at one time by etching, but cleaving must be done on individual rows of devices, and polishing is an even more labor-intensive technique.

Recently, researchers at Xerox Coxp. fabricated a laser using chemically assisted ion beam etching (CAIBE), producing sidewalls with a roughness of 4–6 nm. This is the lowest sidewall roughness ever reported for etching in the III-Nitride material system, but even with this roughness the reflectivity is only 60–70% of the ideal reflectivity, and the roughness is enough to cause interference fringes in the emitted laser beam.

It would be very beneficial to take advantage of the crystal structure of the III-Nitride material itself to produce atomically smooth crystallographic planes without damaging the surface. Such crystallographic planes would have reflectivities greater than 99% of the ideal reflectivity, given by the well known Fresnel formula, as compared to the above values of 1% and 60–70% for plasma etching and CAIBE, respectively. Improvement in facet reflectivity corresponds to higher output power and a better defined laser spot. Wet chemical etching has been used for producing atomically smooth crystallographic planes in other semiconductor materials systems, such as silicon, gallium arsenide, and gallium phosphide. Previously, prior to the invention, this had never been achieved in the III-Nitride materials system.

SUMMARY OF THE INVENTION

The invention provides a method of processing a III-Nitride epitaxial layer system on a substrate. The process includes exposing non-c-plane surfaces of the III-Nitride epitaxial layer system, for example by etching to a selected depth or cleaving, and crystallographically etching the epitaxial layer system in order to obtain crystallographic plane surfaces. In an exemplary embodiment, the III-Nitride epitaxial layer system includes GaN. In accordance with one aspect of the exemplary embodiment, the exposing step includes reactive ion etching in a chlorine-based plasma, PEC etching in a KOH solution or cleaving, and the crystallographically etching step includes immersing the epitaxial layer system in a crystallographic etching chemical, such as phosphoric acid, molten KOH, KOH dissolved in ethylene glycol, sodium hydroxide dissolved in ethylene glycol, tetraethyl ammonium hydroxide, or tetramethyl ammonium hydroxide. Specific etching planes are chosen in accordance with varying the orientation of the exposing step, the etching chemical, and the temperature at which the epitaxial layer system is etched.

BRIEF DESCRIPTION OF THE DRAWINGS

FIG. 4 is a table summarizing etch rates and crystal planes observed for various chemicals used in accordance with the invention;

FIGS. 9A–9C are stepwise block diagrams illustrating the processing of a laser diode in accordance with the invention; and FIGS. 10A–10C are stepwise block diagrams illustrating the processing of a bipolar transistor in accordance with the invention.

DETAILED DESCRIPTION OF THE MENTION

The invention is directed to a method for achieving crystallographic wet chemical etching in the III-Nitrides.

While KOH-based solutions have been found to etch AlN and IneAlN, no acid or base solution had previously been identified that is able to etch high-quality GaN. In accordance with one embodiment of the process of the invention, ethylene glycol, instead of water, is used as a solvent for KOH and NaOH so that temperatures between 90° C. and 180° C. are able to be employed. These temperatures exceed the boiling point of water and are considerably higher than the temperatures used in previous processes. The samples used were grown on c-plane sapphire substrates, and include n-type GaN epilayers grown by metal-organic chemical vapor deposition (MOCVD), MOCVD-grown ptype GaN epilayers, MOCVD-grown AlGaN/GaN heterostructures, and MOCVD-grown InGaN/GaN heterostructures on thick GaN layers grown by hydride vapor phase epitaxy. Epitaxial GaN has commonly a hexagonal crystal structure, and the top surface plane is the c-plane or <0001> plane.

Molten KOH is known to form pits at dislocations in the c-plane of GaN. What was observed in accordance with the invention, however, was that non-c-planes can be crystallographically etched by molten KOH. The c-plane, the top surface of the GaN crystal, is impervious to all of the chemicals with which etching had been attempted. By employing an initial processing step, however, less stable crystal planes are exposed that are susceptible to various chemicals. This unexpected result has been explored in several experiments by the applicants, and applicants have identified other etching solutions that are able to etch various crystallographic planes into not only GaN, but also InGaN and AlGaN. From these experiments, a two-step process for crystallographic etching of the III-Nitrides has been developed.

Figure 2:
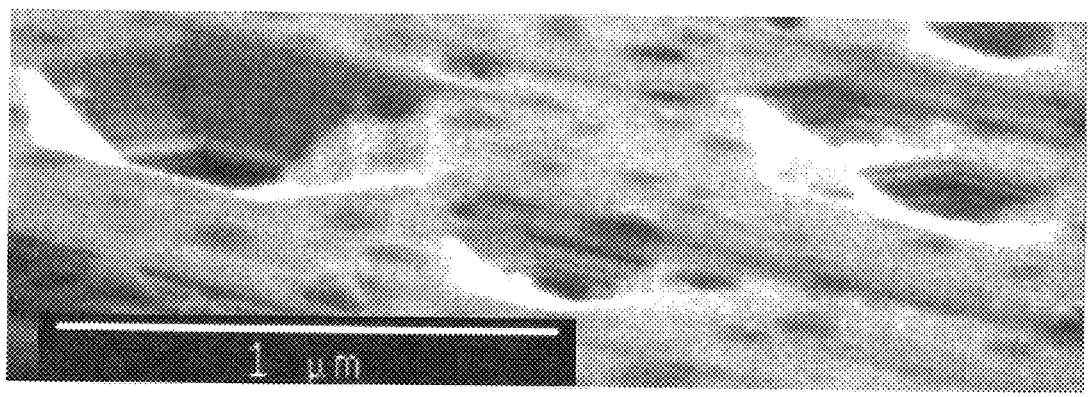
FIG. 2 is a high-resolution field effect SEM image of dislocation etch pits in the c-plane of GaN.

As described before, molten KOH and hot phosphoric acid ($H_3PO_4$) have previously been shown to etch pits at defect sites in the c-plane of GaN. Applicants have now observed the formation of etch pits with facets that correspond to various GaN crystal faces by etching in $H_3PO_4$ above 160° C., in molten KOH above 180° C., in KOH dissolved in ethylene glycol above 135° C., and in NaOH dissolved in ethylene glycol at 180° C. All of the hexagonal etch pits share a common base, i.e. the <$11\bar{2}0$> direction, but intersect the c-plane at a wide variety of angles. This is because the faces are actually produced by two or more competing etch planes, as can be seen in FIG. 2. FIG. 2 is a high-resolution field effect SEM image of dislocation etch pits in the c-plane of GaN, produced by etching in 10% KOH by weight, dissolved in ethylene glycol at 165° C. The etchant temperatures are monitored using a thermocouple, and are accurate to within 5° C. The etch pit density is approximately $2\times10^6$ cm$^{-2}$ in $H_3PO_4$ and $6\times10^7$ cm$^{-2}$ in hydroxide-containing etchants.

Figure 1:
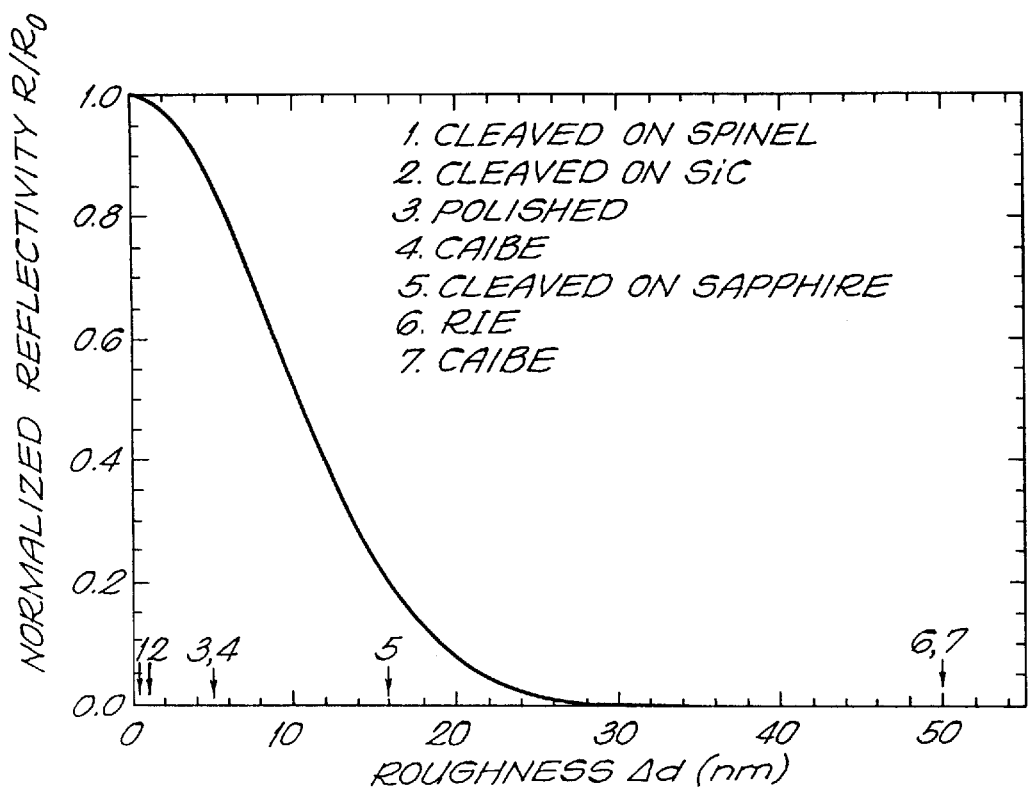
FIG. 1 is a graph of the maximum reflectivity of a laser facet as a function of surface roughness in a typical InOaN/GaN laser structure.
Figure 3:
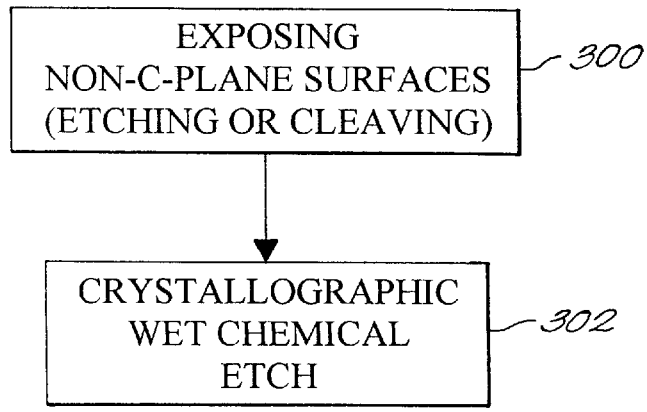
FIG. 3 is a flowchart showing the process of the invention.

FIG. 3 is a flowchart showing the process of the invention. The first of the two steps in the crystallographic etching process, exposing non-c-plane surfaces, can be used to establish the etching depth (step 300), and it can be performed by several common processing methods. For the first step, several different processing methods have been used, including reactive ion etching in a chlorine-based plasma, PEC etching in a KOH solution, and cleaving. The second step is done by immersion in a chemical that is able to crystallographically etch GaN (step 302). This etching step can produce smooth crystallographic surfaces, and the specific etching planes can be chosen by varying the orientation of the first step, the chemical agents, and the temperature. The etch rates and crystal planes observed for all chemicals used in this work are summarized in the table of FIG. 4. Crystallographic etching has been achieved using phosphoric acid, molten potassium hydroxide (KOH), KOH dissolved in ethylene glycol, sodium hydroxide dissolved in ethylene glycol, tetraethyl ammonium hydroxide (TEAH), and tetramehyl ammonium hydroxide (TMAH). The etching planes listed in this table are those that appear during the etch. Because the c-plane {0001} is impervious to all of these chemicals except at defect sites where etch pits occur, it is also an etch plane, with a negligibly small etch rate.

Figure 5A:
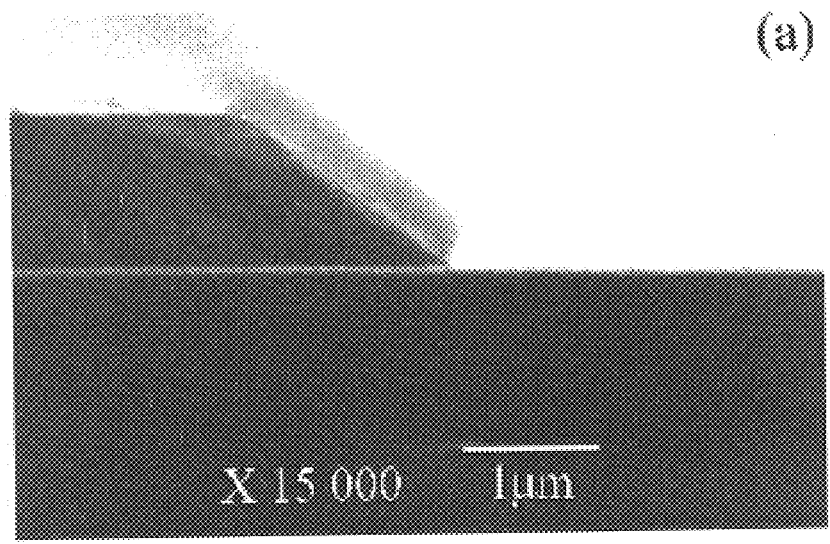
FIGS. 5A–5D are SEM images of several illustrative examples of GaN epilayers crystallographically wet etched after cleaving.
Figure 5B:
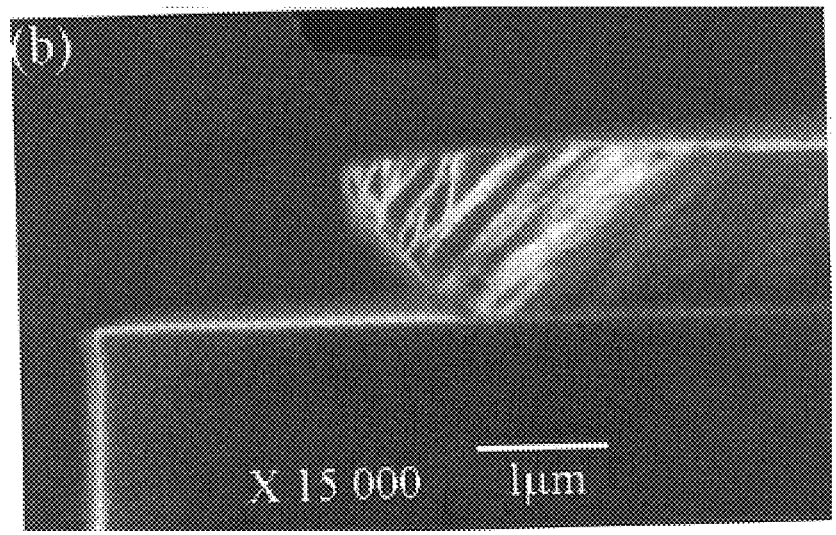
Figure 5C:
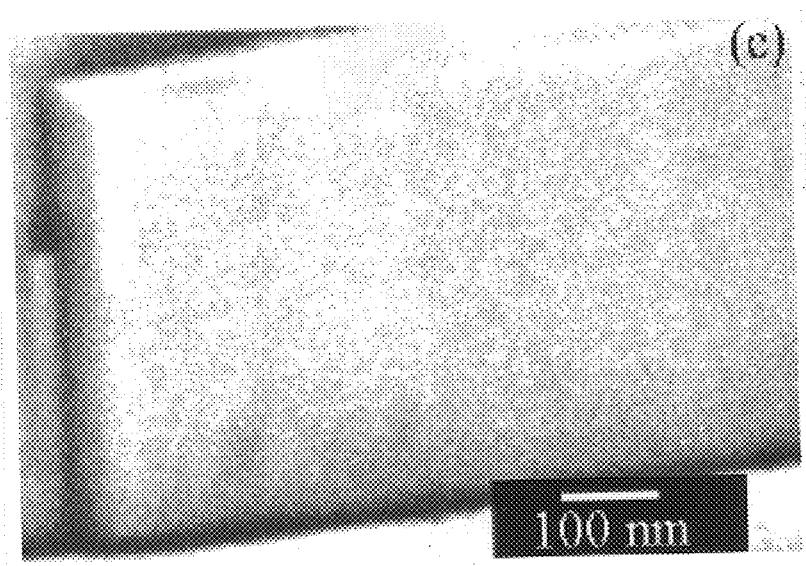
Figure 5D:
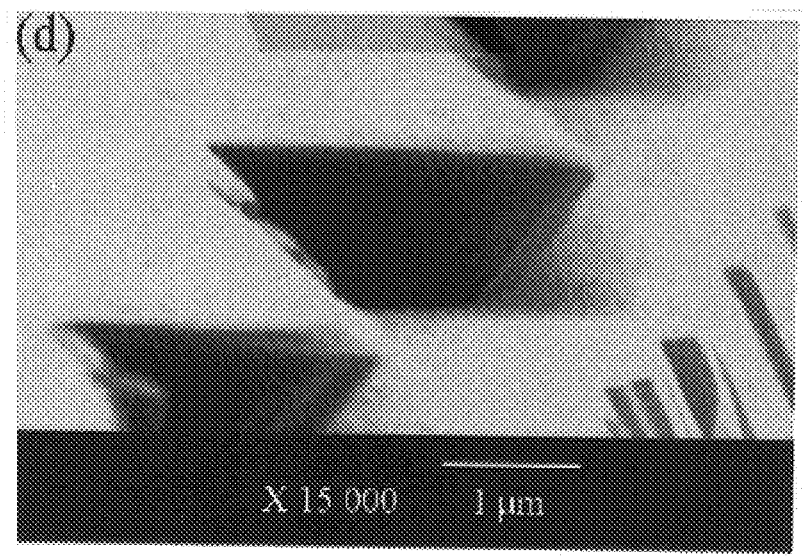

FIGS. 5A–5D are SEM images of several illustrative examples of GaN epilayers that have been crystallographically wet etched after cleaving. FIGS. 5A and 5B show samples etched in $H_3PO_4$ at 132° C. The {$10\bar{1}3$} plane shown in FIG. 5A appears along the side of the sample cleaved along the GaN a-plane {$11\bar{2}0$}. The {$10\bar{1}2$} plane shown in FIG. 5B appears along the side of the sample cleaved along the GaN m-plane. The {$10\bar{1}0$} plane shown in FIG. 5C was produced by etching in 10% KOH by weight dissolved in ethylene glycol at 165° C. This plane has been examined using an FESEM with a resolution of 5 nm at 2.5 kV, and the surface appears perfectly smooth at this resolution. The {$10\bar{1}1$} plane shown in FIG. 5D was produced by etching in molten KOH at 184° C.

Figure 6:
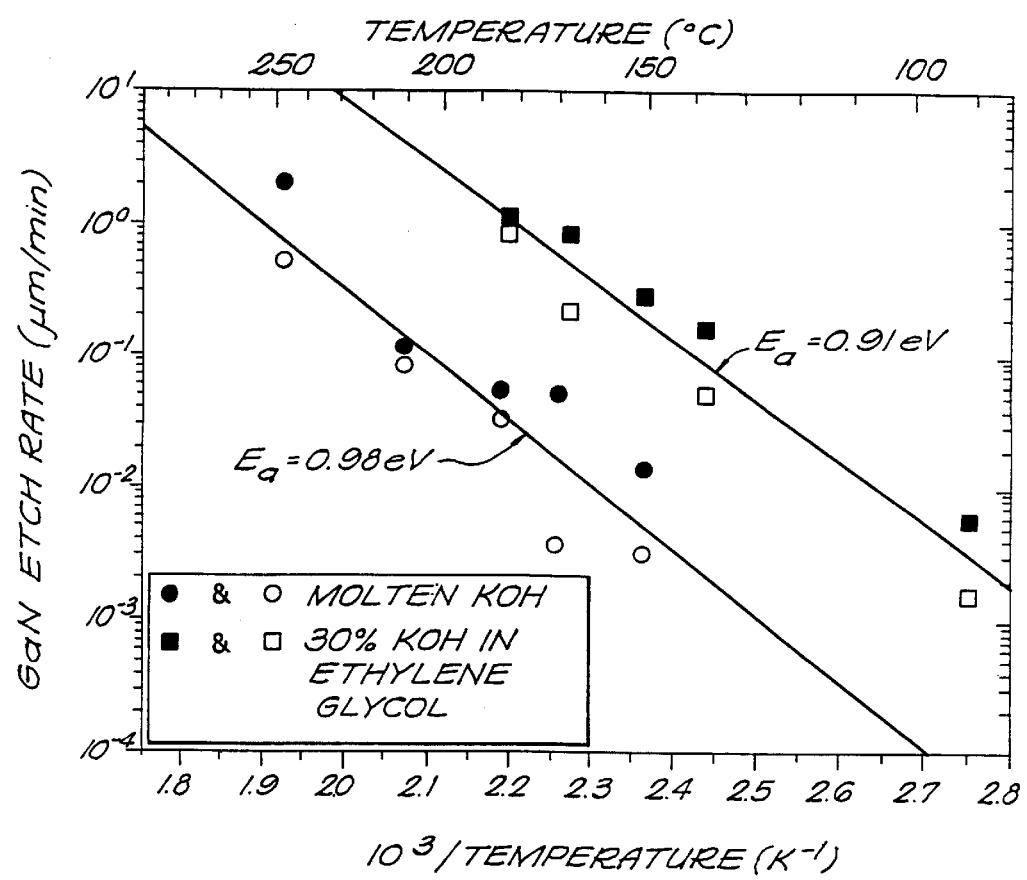
FIG. 6 is an Arrhenius plot of GaN etch rates in KOH and 30% KOH dissolved in ethylene glycol.
Figure 7:
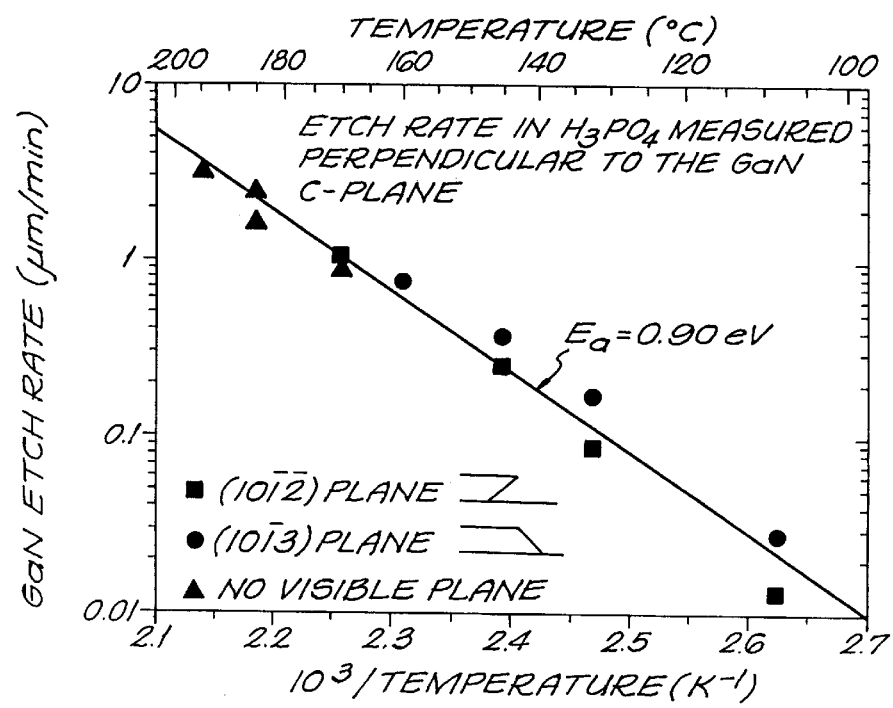
FIG. 7 is an Arrhenius plot of etch rates for GaN in $H_3PO_4$.

The activation energies for etching in these various solutions is 0.9 eV, or 21 kcal/mol, as inferred from the Arrhenius plots in FIGS. 6 and 7. Note that this is equal to the calculated heat of formation of GaN, 0.90 eV. The activation energy indicates that the etch is reaction-rate limited. If the etching were diffusion limited, an activation energy in the 1–6 kcal/mol range would be expected.

FIG. 6 is an Arrhenius plot of GaN etch rates in KOH and 30% KOH dissolved in ethylene glycol. Solid and hollow symbols represent etch rates measured along cleaved edges parallel to the {$11\bar{2}0$} a-plane and the {$10\bar{1}0$} m-plane, respectively.

FIG. 7 is an Arrhenius plot of etch rates for GaN in $H_3PO_4$.

Figure 8:
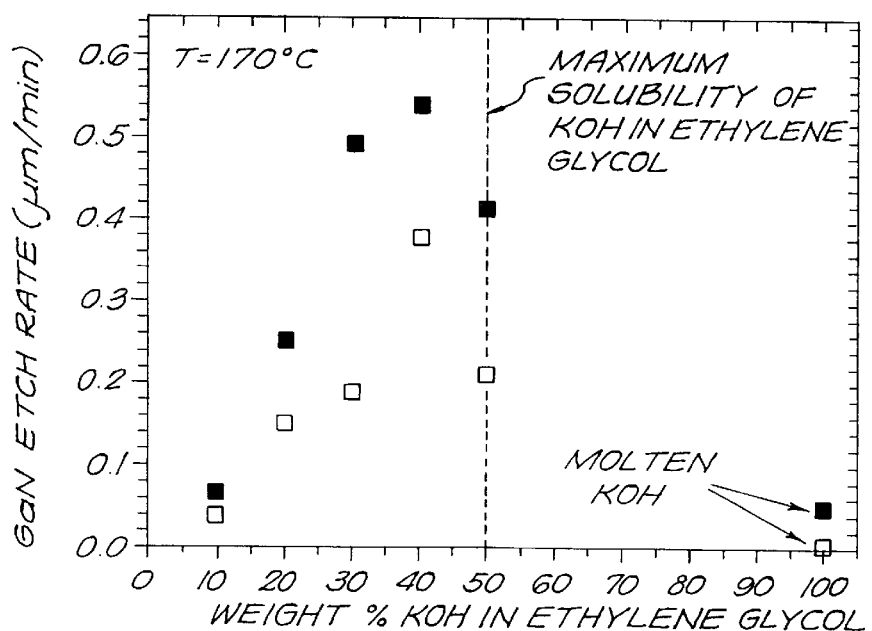
FIG. 8 is a plot of GaN etch rate as a function of KOH concentration in ethylene glycol at 170° C.

FIG. 8 is a plot of GaN etch rate as a function of KOH concentration in ethylene glycol at 170° C. Solid and hollow symbols represent etch rates measured along cleaved edges parallel to the {$11\bar{2}0$} a-plane and the {$10\bar{1}0$} m-plane, respectively.

The etch rates shown in FIGS. 6–8 are measured perpendicular to the growth direction, i.e. in the "horizontal" c-plane. For "vertical" planes, such as the {$10\bar{1}0$} plane, the actual etch rate of the plane is equal to the etch rate measured. For non-vertical planes, however, the etch rate of the plane is actually less than the measured etch rate. The etch rate perpendicular to the {$10\bar{1}2$} plane, for instance, is the etch rate shown in FIG. 7 multiplied by cos(46°), because the {$10\bar{1}2$} plane intersects the vertical {$10\bar{1}0$} plane at an angle of 46°.

It is interesting to note that the etch rate of KOH dissolved in ethylene glycol is higher than the etch rate of molten KOH at the same temperature. In fact, the etch rate as a function of concentration peaks at a value of 40% KOH by weight in ethylene glycol, as can be seen in FIG. 8. It is believed that this is due to high solubility of the etch products in ethylene glycol.

Because the c-plane is impervious to all of the chemicals used in this study, no etch mask is required for the crystallographic etching step. The c-plane itself acts as a mask. An etch mask may be necessary, however, if long etching times are used, to prevent the development of etch pits at defect sites. For this purpose we have successfully used titanium masks after annealing at 900° C. for 30 seconds and nickel masks after annealing at 650° C. for 2 minutes.

FIGS. 9A–9C are step-wise block diagrams illustrating the processing of a laser diode in accordance with the invention. Initially, a mask 900 is deposited on a III-Nitride device structure 902, which is configured on a sapphire substrate 904. A reactive ion etch leaves rough, non-vertical facets 906 in the structure. A crystallographic etch produces atomically smooth vertical facets 908, 910.

FIGS. 10A–10C are step-wise block diagrams illustrating the processing of a bipolar transistor in accordance with the invention. Initially, a mask 1000 is deposited on a III-Nitride device structure 1002, which is configured on a sapphire substrate 1004. A photoenhanced wet etch leaves nearly vertical walls 1006 and rough surfaces 1008. A crystallographic etch produces undercut walls 1010, 1012 and atomically smooth surfaces 1014.

In conclusion, a powerful anisotropic wet chemical etching technique is presented. Etch rates as high as 3 μm/min have been demonstrated. Because the etch is crystallographic in nature, we demonstrate smooth vertical sidewalls with an RMS roughness smaller than the 5 nm resolution of the FESEM. This is the smallest reported roughness for etched GaN sidewalls, indicating the usefulness of this etch for high-reflectivity laser facets. The ability to undercut is also important for decreasing capacitance in applications such as bipolar transistors.

Although the present invention has been shown and described with respect to several preferred embodiments thereof, various changes, omissions and additions to the form and detail thereof, may be made therein, without departing from the spirit and scope of the invention.

What is claimed is:

1. A method of processing a III-Nitride epitaxial layer system provided on a substrate, comprising:

exposing non-c-plane surfaces of said III-Nitride epitaxial layer system; and crystallographically etching said epitaxial layer system in order to obtain crystallographic plane surfaces.

2. The method of claim 1, wherein said III-Nitride epitaxial layer system comprises GaN.

3. The method of claim 1, wherein said exposing step comprises reactive ion etching in a chlorine-based plasma, PEC etching in a KOH solution or cleaving.

4. The method of claim 1, wherein said crystallographically etching step comprises immersing said epitaxial layer system in a crystallographic etching chemical.

5. The method of claim 4, wherein said chemical comprises phosphoric acid, molten KOH, KOH dissolved in ethylene glycol, sodium hydroxide dissolved in ethylene glycol, tetraethyl ammonium hydroxide or tetramethyl ammonium hydroxide.

6. The method of claim 4, wherein specific etching planes are chosen in accordance with varying the orientation of said first etching step, said etching chemical, and the temperature at which said epitaxial layer system is etched.

7. The method of claim 1, wherein a laser diode is processed.

8. The method of claim 1, wherein a bipolar transistor is processed.

9. A method of processing a III-Nitride epitaxial layer system provided on a substrate to produce a laser diode, comprising:

reactive etching said III-Nitride epitaxial layer system to a selected depth; and crystailographically etching said epitaxial layer system in order to obtain substantially atomically smooth vertical surfaces.

10. A method of processing a III-Nitride epitaxial layer system provided on a substrate to produce a bipolar transistor, comprising:

photoenhanced wet etching said III-Nitride epitaxial layer system to a selected depth; and crystallographically etching said epitaxial layer system in order to obtain undercut walls and substantially atomically smooth surfaces.

11. A method of processing a III-Nitride epitaxial layer system comprising:

providing a III-Nitride epitaxial layer system on a substrate; and wet chemical crystallographic etching said epitaxial layer system along non-c-plane crystal directions.

12. The method of claim 11, wherein said epitaxial layer system comprises GaN.

13. A method of processing a III-Nitride epitaxial layer system comprising:

providing a III-Nitride epitaxial layer system on a substrate; and crystallographically etching said epitaxial layer system by immersing said epitaxial layer system into a liquid chemical.

14. The method of claim 13, wherein said epitaxial layer system comprises GaN.

15. The method of claim 13, wherein said liquid chemical includes molten KOH, KOH dissolved in ethylene glycol, NaOH dissolved in ethylene glycol, phosphoric acid, tetraethyl ammonium hydroxide, or tetramethyl ammonium hydroxide.

16. The method of claim 13, wherein said liquid chemical is heated.

17. A method of processing a III-Nitride epitaxal material system comprising:

providing a III-Nitride epitaxial layer system on a substrate;

etching said epitaxial layer system along c-plane crystal directions; and wet chemical crystallographic etching said epitaxial layer system along non-c-plane crystal directions.

18. The method of claim 17, wherein said epitaxial layer system comprises GaN.

19. The method of claim 17, wherein said first etching step comprises reactive ion etching, ion milling, low-energy electron enhanced etching, photo-electrochemical etching, chemically assisted ion beam etching, or enhanced forms of reactive ion etching.

20. A method of processing a GaN layer in order to produce semiconductor laser facets comprising:

providing a GaN on a substrate; and wet chemical crystallographic etching said GaN layer in order to obtain substantially atomically flat surfaces.

* * * * *